(12) United States Patent
Liran et al.

(10) Patent No.: US 9,935,636 B1
(45) Date of Patent: Apr. 3, 2018

(54) CMOS INPUT BUFFER WITH LOW SUPPLY CURRENT AND VOLTAGE DOWN SHIFTING

(71) Applicants: Tuvia Liran, Qiryat Tivon (IL); Neil Feldman, Misgav (IL); Uzi Zangi, Hod-Hasharon (IL)

(72) Inventors: Tuvia Liran, Qiryat Tivon (IL); Neil Feldman, Misgav (IL); Uzi Zangi, Hod-Hasharon (IL)

(73) Assignee: PLSense Ltd., Yokneam Elit (IL)

( * ) Notice: Subject to any disclaimer, the term of this patent is extended or adjusted under 35 U.S.C. 154(b) by 0 days.

(21) Appl. No.: 15/455,151

(22) Filed: Mar. 10, 2017

(51) Int. Cl.
*H03K 19/0175* (2006.01)
*H03K 19/0185* (2006.01)
*H03K 19/00* (2006.01)

(52) U.S. Cl.
CPC . *H03K 19/018521* (2013.01); *H03K 19/0013* (2013.01)

(58) Field of Classification Search
CPC ............... H03K 19/0013; H03K 19/018521

USPC .......................................................... 326/80
See application file for complete search history.

(56) References Cited

U.S. PATENT DOCUMENTS

| | | | | |
|---|---|---|---|---|
| 5,790,612 A * | 8/1998 | Chengson | ............... | H03K 5/131 327/148 |
| 8,643,418 B2 * | 2/2014 | Ma | ................... | H03K 19/00361 327/170 |
| 8,742,822 B2 * | 6/2014 | Yanagidaira | ......... | H03K 17/063 326/62 |
| 9,166,585 B2 * | 10/2015 | Roy | ................... | H03K 19/0013 |

* cited by examiner

*Primary Examiner* — Don Le

(57) ABSTRACT

A method for implementing a CMOS input buffer that consumes very low current even when input levels are less than full swing. An additional optional stage enables conversion to very low voltage swing. The circuit can be manufactured with a standard CMOS processing technology and with high immunity to variation of process parameters. The circuit provides some hysteresis response, enhancing the input voltage margin.

7 Claims, 6 Drawing Sheets

Schematics of the low supply current input buffer with level shifter down

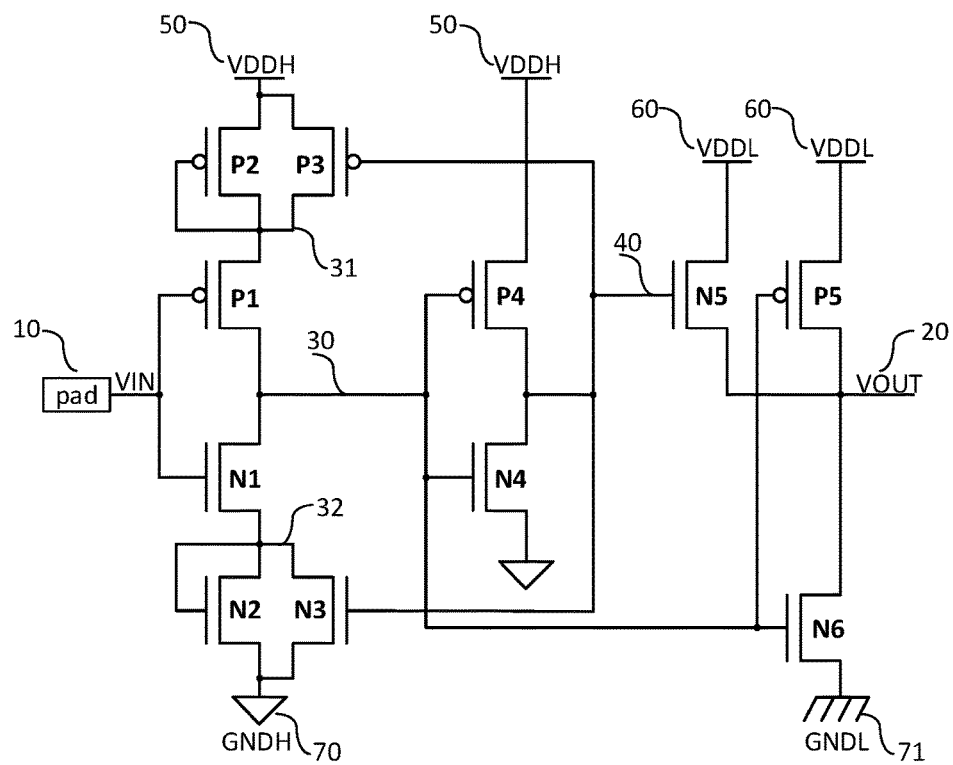
Figure 1: Schematics of the low supply current input buffer with level shifter down

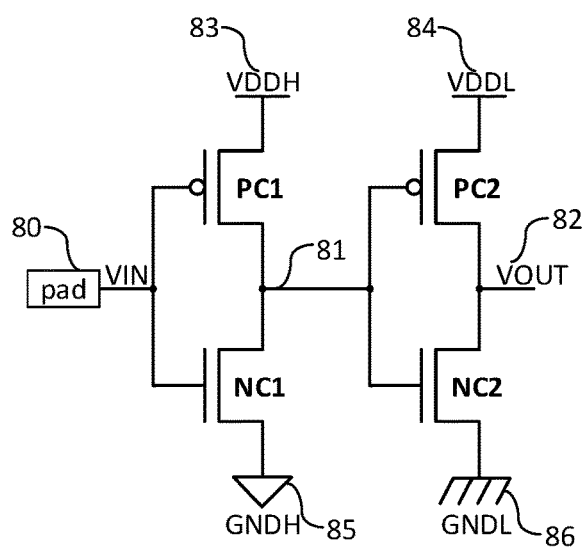
Figure 2: Schematic of conventional CMOS input buffer (prior art)

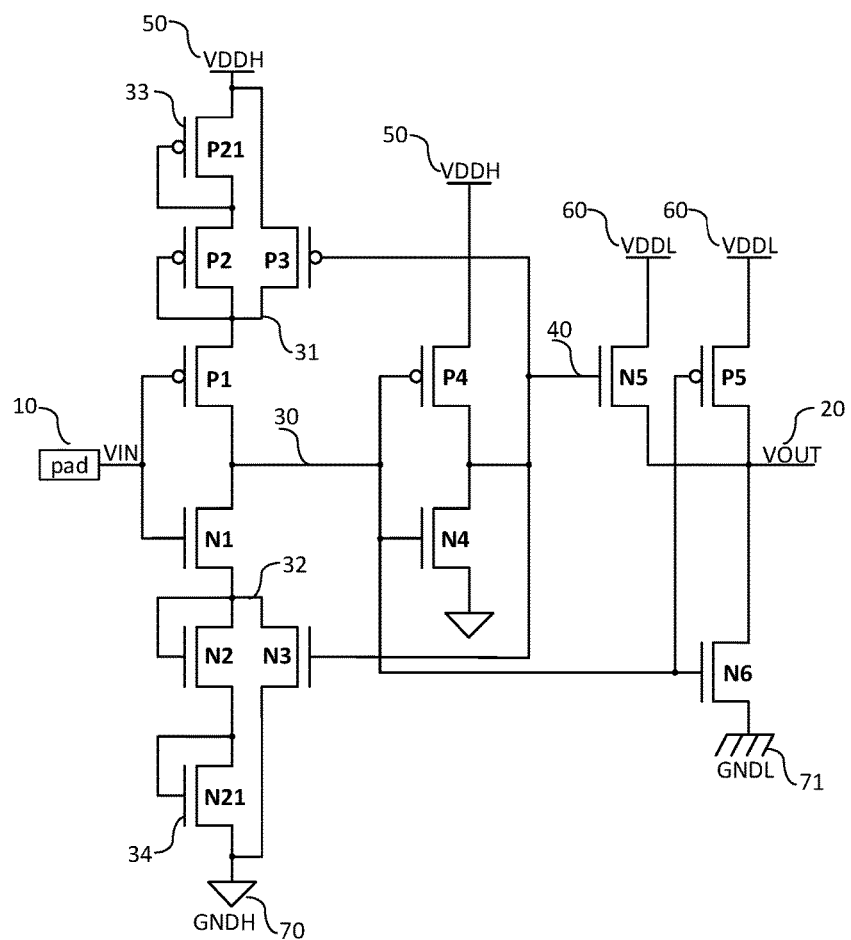
Figure 3: Schematics of a version of the embodiment of this invention input buffer with extended hysteresis

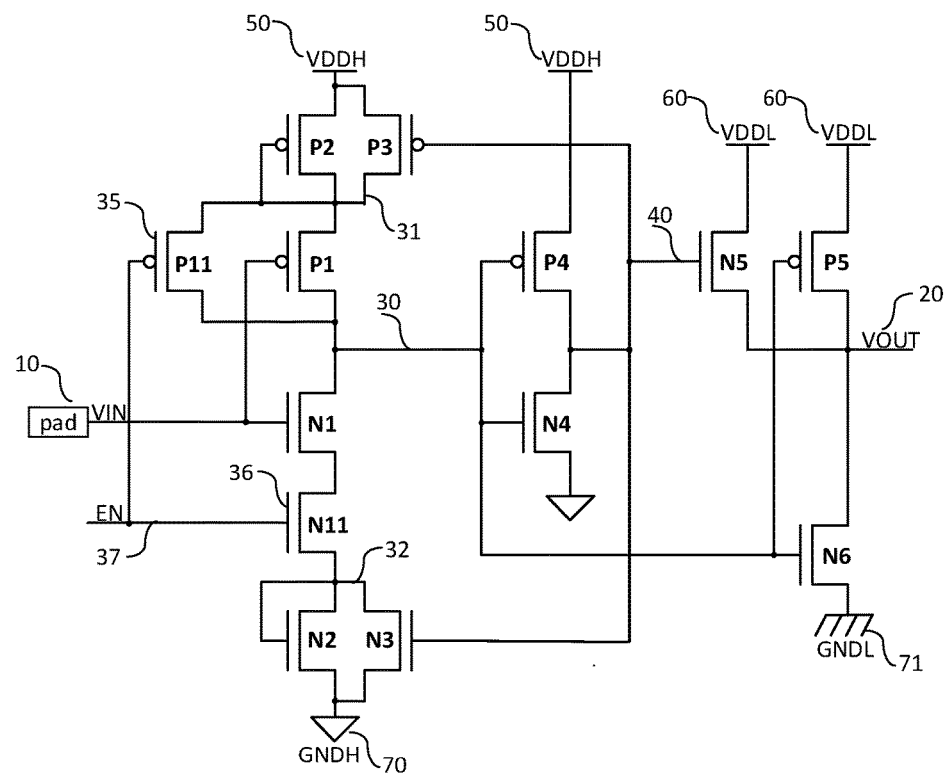
Figure 4: Schematic of the embodiment of this invention input buffer where the first stage is a NAND gate

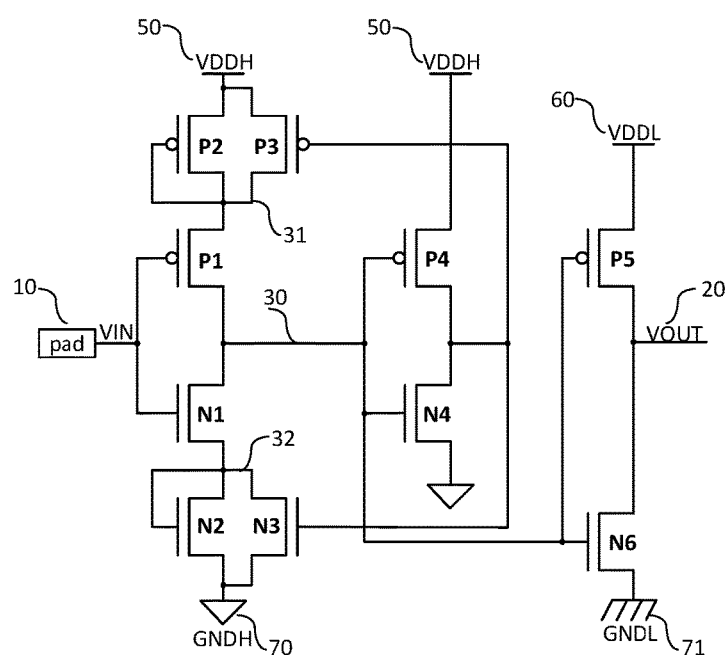
Figure 5: Schematic of a version of the embodiment of this invention input buffers with PMOS only in pull-up of 2nd stage

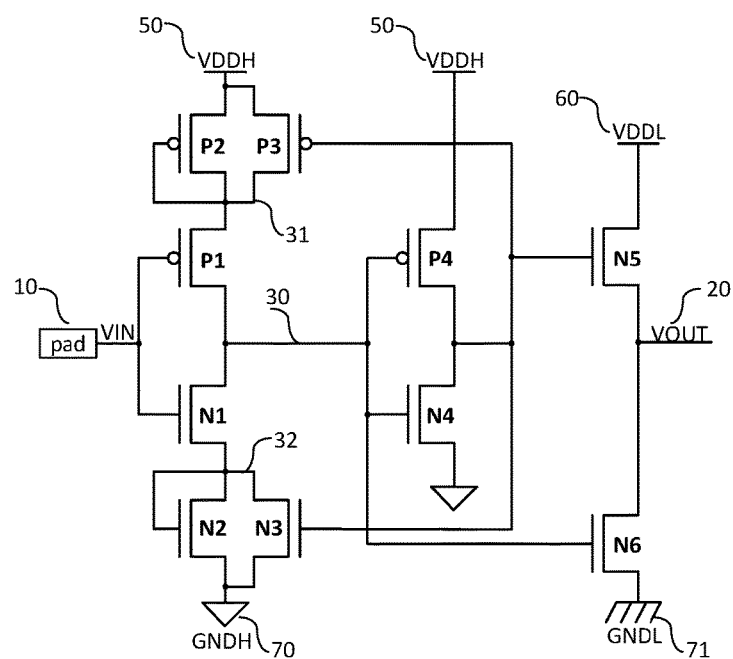
Figure 6: Schematic of a version of the embodiment of this invention input buffers with NMOS only in pull-up of 2nd stage

CMOS INPUT BUFFER WITH LOW SUPPLY CURRENT AND VOLTAGE DOWN SHIFTING

FIELD OF THE INVENTION

The invention relates to CMOS input buffer and more specific to low-power design of input buffers.

BACKGROUND OF THE INVENTION

The conventional circuit for input buffer for CMOS technology is based on conventional CMOS inverters, as presented in FIG. 2. In that circuit, NMOS transistor NC1 and PMOS transistor PC1 (as show in FIG. 2) act as input stage inverter, which is powered by VDDH supply (node 83 in FIG. 2), and provides output voltage levels of VDDH and GNDH (node 85 in FIG. 2). The second stage is a CMOS inverter, constructed by NMOS transistor NC2 and PMOS transistor PC2 (as show in FIG. 2), powered by VDDL supply (node 84 on FIG. 2), which is typically the same or lower voltage than VDDH. VDDL is typically equal to the core voltage of the integrated circuit. The input signal to this circuit is names VIN (node 80 on FIG. 2), and the output signal is named VOUT (node 82 on FIG. 2).

The circuit in FIG. 2 has several disadvantages, which are:
1. The supply current when VIN is higher than GNDH, or lower than VDDH is relatively high due to the short circuit between PC1 and NC1 transistors which are both open, consuming a significant amount of power. In applications that requires low power consumption, this is a significant drawback.
2. The current between VDDH to GNDH during transition of VIN is relatively high, since both NC1 and PC1 have gate to source voltage that exceeds their threshold levels. This current is called short circuit current between PC1 and NC1, in which both transistors are conducting. This effect causes a significant consumption of current, especially when VDDH is high and when input transition time is long. In applications that requires low power consumption, this is a significant drawback.
3. When VDDL is very low, typically when VDDL<Vtn+|Vtp| (Vtn is the threshold voltage of the NMOS transistor; Vtp is the threshold voltage of the PMOS transistor), the transition time and the delay time on the output of the first inverter (node 81 in FIG. 2) are very high. This fact increases the delay of this cell, and might cause the second inverter to consume high short circuit current. This is a significant drawback when core voltage is very low, such as in the case of ultra-low power applications.
4. When the voltage of VDDH is significantly higher than VDDL, the difference between the delay when VIN is rising, relative to the delay when VIN is falling, is high. This asymmetric delay might cause timing issues in the integrated circuit.

U.S. Pat. No. 4,958,088 describes a CMOS input buffer with hysteresis, but it does not reduce the current due to non-full swing input signal, and output level is the same as input level.

U.S. Pat. No. 5,304,867 describes a high speed and low power CMOS input buffer. It is intended for TTL input signal levels, and does not have the mechanism for reducing the supply current when VIN is slightly above GNDH. In addition, output voltage levels are the same as input voltage levels.

BRIEF SUMMARY OF THE INVENTION

This invention describes the circuit in FIG. 1. The logic function is the same as in the prior art presented in FIG. 2, but it provides several significant advantages.

For one embodiment of the invention, the target is to reduce the supply current consumption to the minimum possible, mostly for supporting applications where power consumption is a critical parameter. This goal is addressing both the cases where input voltage level is not forcing the input stage of the buffer to very deep near or sub-threshold levels for long time, when the input signal is switching, and when the input signal is noisy because of ringing.

Additionally, embodiments of the invention also include increase of the noise margin of the input signal, and mitigate the cases when input transition time is fairly long, and input signal is noisy during the transition. Such cases might cause undesired spikes at the output of the buffer.

Additionally, embodiments of the invention also target for driving wide range of core supply voltages (VDDL, node 60 on FIG. 1), driven by wide range of I/O supply voltages (VDDH, node 50 on FIG. 2). This is significantly essential when the core supply voltage is very low, such as in the case of ultra-low power applications, where the core supply voltage might be at ~0.5V or below.

Additionally, embodiments of the invention target that the conversion from high supply voltage (VDDH) to low supply voltage (VDDL), will be done with minimum power consumption and with minimum delay, even when the core voltage is very low.

BRIEF DESCRIPTIONS OF THE DRAWINGS

The invention may be understood by referring to the following description and accompanying drawings that are used to illustrate embodiments of the invention. In the drawings:

FIG. 1 is a schematics of the low supply current input buffer with level shifter down, which describes the embodiments of this invention circuit.

FIG. 2 is a schematic of conventional CMOS input buffer, which is the prior art for this invention.

FIG. 3 is one example schematic of a version of the embodiment of this invention input buffer with extended hysteresis range.

FIG. 4 is another example schematic of the embodiment of this invention input buffer where the first stage is a NAND gate.

FIG. 5 is another example schematic of the embodiment of this invention for input buffers with PMOS only in pull-up of 2nd stage.

FIG. 6 is another example schematic of the embodiment of this invention input buffers with NMOS only in pull-up of 2nd stage.

DETAILED DESCRIPTION OF THE INVENTION

The present invention includes a method and apparatus for a low power CMOS input circuit typically connected to the bonding pads of input/output (I/O) pins of integrated circuits. It can be used either as a complete cell that performs the input buffering of signals entering the integrated circuit, or integrated in a more complex input/output circuit, such as bi-directional input/output buffer.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

For one embodiment of the invention, the implemented circuit can translate various logic level input signals into internal low voltage logic level signals. Power consumption is minimized by the invention in order to maximize the operating power consumption for a battery-operated system, or for enabling the use with energy harvesting power source.

The invented circuit can be manufactured by various CMOS (Complementary Metal Oxide Semiconductor) processes. Typically, the process vendors offer transistors that can operate at least in two ranges of supply voltage—NMOS and PMOS transistors with thick gate oxide intended for use in the high voltage domain; NMOS and PMOS transistors with thin gate oxide intended for use in the low voltage domain. For another embodiment of the invention, the implemented circuit uses only transistors with thick gate oxide, even when the supply voltage is low. The symbols of the thick oxide NMOS transistors is the one used for all devices named Ni (i is the index number). The symbols of the thick oxide PMOS transistors is the one used for all devices named Pi (i is the index number).

In all the figures describing schematics, the bulk connection is not described. Typically, the bulk of all NMOS transistors is connected to the P-well, or the P+ substrate of the integrated circuit, and it is connected electrically to the negative supply voltage of each circuit. The bulk of all PMOS transistors is connected to the N-well, and it is connected electrically to the positive supply voltage of each circuit.

FIG. 1 describes the schematics of the embodiments of this invented circuit. The circuit can be divided into two stages. The first stage, named input stage, includes the circuits that are powered by VDDH (node 50 of FIG. 1), which is the supply voltage of the I/O domain. The second stage, named level down stage, includes the circuit that is powered by VDDL (node 60 or FIG. 1), which is typically the supply voltage of the core of the integrated circuit. VDDL (node 60 or FIG. 1) can be the same voltage, or lower voltage than VDDH (node 50 of FIG. 1). When the voltage of VDDL (node 60 or FIG. 1) is very low, typically below Vtn+|Vtp|, this circuit has significantly less delay and transition time compared to the prior art circuit. In a case that the core supply voltage is the same as I/O supply voltage, the second stage is not necessary, and only the first stage can be used.

The schematic of the implemented circuit in FIG. 1 is only an example. This implementation might have several versions, based on the same concept. Some of these versions are presented in FIGS. 3, 4, 5 and 6. They will be described in details later on.

For one embodiment of the invention, the input stage, which is typically connected to the pad, and is typically connected to the routing in the package by bond wire or bump. This pad is typically protected from ESD damage, thus require a protection circuit, which are not described here, since it is beyond the scope of this invention.

The input stage should overcome all the non-perfections of the input signal, and generate a "clean" digital signal, which can be used by internal circuits, while mitigating all the potential hazards. The key potential non-perfections of the input signal might be:

1. Low level that is higher than GNDH: This might be due to variations of the GNDH voltage between the transmitter and the receiver integrated circuits. in this case, the sub-threshold current of NC1 NMOS transistor in FIG. 2 which is shown in the conventional circuit increases its sub-threshold current exponentially, typically by 70÷80 mV/decade. For example, when VIN=300 mV, the current is ~1000× higher than when VIN=0V.
2. High level that is lower than VDDH: It is similar situation as in the previous case, which also might be caused when the transmitter and receiver circuits are powered by different supply sources. In this case, the sub-threshold current of PC1 PMOS transistor in FIG. 2 which is shown in the conventional circuit increases its sub-threshold current exponentially.
3. Slow rise or fall time: The direct current between VDDH and GNDH is much higher at intermediate voltages, mostly when Vtn<VIN<VDDH−|Vtp|. When the transition time is long, this short circuit current is conducting for a long time, causing increased high current.
4. Ringing or noise of the input signal relative to VDDH (node 50 of FIG. 1) or GNDH (node 70 of FIG. 1): Input signal might ring or might be noisy, either due to impedance mismatch between the transmission line impedance of the conducting traces and the input impedance of the input buffer, or due to fast switching of other buffers in the receiving integrated circuits, or due to other noise mechanisms affecting the input signal or the supply voltage. In this case, the VIN voltage (node 10 of FIG. 1) might be higher than GNDH (node 70 of FIG. 1) or lower than VDDH (node 50 of FIG. 1) temporarily, causing increased current during the ringing.
5. Noise during signal switching: When input signal has slow transition time, and there is noise added to it, and the input buffer has a single switching threshold, the input signal might cause multiple crossing of the threshold. This effect might generate undesired extra pulses.

For one embodiment of the invention, the implemented circuit mitigate all these undesired effects. The near or sub-threshold current is mitigated by doubling the effective threshold voltage. The current during transition is reduced by reducing the overdrive voltage. The potential issue of multiple pulses is mitigated by generating hysteresis response of the buffer.

For one embodiment of the invention, the operation of the first stage of this invention circuit, as presented in FIG. 1, is the following:

1. When VIN (node 10 of FIG. 1) increases from 0V, gate to source voltage of N1 transistor at FIG. 1 will exceed the threshold voltage only when N2 transistor at FIG. 1 will also exceed the threshold voltage. This means that current will conduct only when VIN>2*Vtn. When VIN (node 10 of FIG. 1) is low, node 40 in FIG. 1 is also low, causing N3 transistor at FIG. 1 to be off, thus it is not interfering with this operation.
2. When VIN (node 10 of FIG. 1) decreases from VDDH (node 50 of FIG. 1), gate to source voltage of P1 transistor at FIG. 1 will exceed the threshold voltage only when P2 transistor at FIG. 1 will also exceed the threshold voltage. This means that current will conduct only when VIN<VDDH−2*|Vtp|. When VIN (node 10 of FIG. 1) is high, node 40 in FIG. 1 is also high, causing P3 transistor at FIG. 1 to be off, thus it is not interfering with this operation.

3. When VIN (node 10 of FIG. 1) is rising, and increases above ~2*Vtn, the overdrive voltage (which is the gate voltage above the threshold voltage) on the NMOS transistor N1 (at FIG. 1) is ~VIN−2*Vtn, and the overdrive on the PMOS transistor P1 (at FIG. 1) is ~VDDH−VIN−|Vtp|. Since the threshold of the NMOS pull-down field effect transistors is effectively double that of the threshold of the PMOS pull-up field effect transistors, the circuit will switch state only when VIN (node 10 at FIG. 1) voltage will exceed VDDH/2. This means that the low voltage margin of VIN (node 10 at FIG. 1) is larger than VDDH/2.

4. When VIN (node 10 of FIG. 1) is rising, and increases above the switching point of the first stage, the voltage on node 30 in FIG. 1 drops, and the voltage on node 40 in FIG. 1 increases. This is causing N3 (NMOS transistor at FIG. 1) to turn on, and P3 (PMOS transistor at FIG. 1) to turn off. When this is happening, the overvoltage on N1 (NMOS transistor at FIG. 1) becomes VIN−Vtn, and the overvoltage on P1 (PMOS transistor at FIG. 1) becomes VDDH−VIN−2*|Vtp|. After this switching, the VIN (node 10 at FIG. 1) is higher than the switching level of the circuit by an extra voltage of ~Vtn (or |Vtp|, which is fairly similar), causing a fast and full swing switching of the output of this stage.

5. When VIN (node 10 of FIG. 1) is falling, and decreases below ~VDDH−2*|Vtp|, the overdrive voltage on the PMOS transistor P1 in FIG. 1 is ~VDDH−VIN−2*|Vtp|, and the overdrive on the NMOS transistor N1 in FIG. 1 is ~VIN−|Vtp|. Since the threshold of the PMOS pull-up field effect transistors is effectively double that of the threshold of the NMOS pull-down field effect transistors, the circuit will switch state only when VIN (node 10 at FIG. 1) voltage will drop below VDDH/2. This means that the high voltage margin of VIN (node 10 at FIG. 1) is larger than VDDH/2.

6. When VIN (node 10 of FIG. 1) is falling, and decreases below the switching point of the first stage, the voltage on node 30 in FIG. 1 rises, and the voltage on node 40 in FIG. 1 drops. This is causing N3 (NMOS transistor at FIG. 1) to turn off, and P3 (PMOS transistor at FIG. 1) to turn on. When this is happening, the overvoltage on N1 (NMOS transistor at FIG. 1) becomes VIN−2*Vtn, and the overvoltage on P1 (PMOS transistor at FIG. 1) becomes VDDH−VIN−|Vtp|. After this switching, the VIN (node 10 at FIG. 1) is lower than the switching level of the circuit by an extra voltage of ~Vtn (or |Vtp|, which is fairly similar), causing a fast and full swing switching of the output of this stage.

Based on simulations performed on typical circuit implementations and typical process, voltages and temperatures of the circuits in FIG. 1 and FIG. 2, it was concluded that:

1. Maximum direct current from VDDH (node 50 of FIG. 1) to GNDH (node 70 of FIG. 1) is lower in the embodiment of this invention circuit, relative to the conventional circuit (prior art) by 30÷50%.

2. Direct current from VDDH (node 50 of FIG. 1) to GNDH (node 70 of FIG. 1) when VIN=0.2*VDDH, or when VIN=0.8*VDDH, is lower in the embodiment of this invention circuit, relative to the conventional circuit (prior art) by >200×.

3. The embodiment of this invention circuit is generating hysteresis response of the output of the first stage, node 30 of FIG. 1, due to changes in VIN (node 10 of FIG. 1). The conventional circuit (prior art) have no hysteresis. As a result, the embodiment of this invention circuit has noise margin that is typically 20÷40% higher than for the conventional circuit (prior art).

It can be noted that the maximum drain to source voltage of transistors N2 and P2 of FIG. 1 is constrained, typically less than double of the threshold voltage of the NMOS and PMOS field effect transistors respectively. As a result, it is possible to implement these transistors with transistors that are intended to operate at lower voltages, which might have lower threshold voltages, and typically several optional threshold voltages. This characteristic enables tuning the hysteresis of the circuit of this invention (show in FIG. 1), making it proportional to the threshold voltages of transistors N2 and P2 of FIG. 1.

For another embodiment of the invention, the level down stage is implemented by transistors N5, N6 and P5 of FIG. 1. The function of this stage is to convert the voltage levels from VDDH (node 50 of FIG. 1) and GNDH (node 70 of FIG. 1) to VDDL (node 60 of FIG. 1) and GNDL (node 71 of FIG. 1). VDDL (node 60 of FIG. 1) voltage is the same or lower than VDDH (node 50 of FIG. 1), and might be even below the transistor threshold voltage which is typically ~0.5V, thus enables supporting applications of ultra-low power. GNDL (node 71 of FIG. 1) is typically the same voltage as GNDH (node 70 of FIG. 1), but since these signals are separated, they might have uncorrelated noises and/or ringing.

The operation of the circuit is the following:

1. When node 30 of FIG. 1 is high, transistor N5 of FIG. 1 is on, pulling down node 20 of FIG. 1, which is the output of this stage.

2. While node 30 of FIG. 1 is high, node 40 of FIG. 1 is low, turning off N6 of FIG. 1. As a result, it does not cause contention with transistor N5 of FIG. 1, but complements it.

3. When node 30 of FIG. 1 is low, forcing node 40 of FIG. 1 to high, transistor N5 of FIG. 1 is off, and transistor N6 of FIG. 1 is on, pulling up node 20 of FIG. 1.

4. Transistor P5 of FIG. 1, which is a PMOS transistor, is responsible for the pull-up of node 20 of FIG. 1 in the cases that VDDH<VDDL+Vtn. It functions like an inverter, together with transistor N5 of FIG. 1, but it is typically fairly weak at very low voltage levels of VDDL (node 71 of FIG. 1). Transistor P5 of FIG. 1 is typically small, thus typically consumes very small area and very low power.

Simulations performed on typical circuit implementations and typical process, voltages and temperatures of the second stage of the invented circuits in FIG. 1, compare to prior art circuit in FIG. 2, indicate that the embodiment of this invention circuit is significantly faster, and has significantly less transition time than the conventional prior art circuit of FIG. 2. Thus, the embodiment of this invention circuit is preferred for applications of ultra-low power.

Description of Different Example Circuits of this Invention

The embodiments of this invention circuit, as described in FIG. 1, might have plurality of variations, based on similar principles of operations.

For one example embodiment of the invention, the pull-down section of the first stage is implemented similar to transistors N1, N2 and N3 of FIG. 1, while the pull-up section of the first stage might have different embodiment than in FIG. 1.

For another example embodiment of the invention, the pull-up section of the first stage is implemented similar to transistors P1, P2 and P3 of FIG. 1, while the pull-down section of the first stage might have different embodiment than in FIG. 1.

For another example embodiment of the invention, the first stage might have enlarged noise margin of VIN (node 10 of FIG. 1). FIG. 3 describes such embodiment, where transistors N2 and N21 of FIG. 3 replace transistor N2 of FIG. 1. Similarly, and optionally, transistors P2 and P21 of FIG. 3 replace transistor P2 of FIG. 1. Since transistors N2, N21, P2 and P21 of FIG. 3 are diode-connected, by connecting the drain of each transistor to its gate, the effective threshold voltage of the two serially connected diode-connected diodes is doubled. As a result, the range of the hysteresis window for the first stage of FIG. 1 can be expanded, fairly similar to the use of N2 and P2 in FIG. 1 with larger effective threshold voltages. It is also possible to implement more than two serially diode-connected NMOS or PMOS transistors, replacing N2 and P2 in FIG. 1, or to implement any of these serially diode-connected transistors with transistors with various threshold voltages.

For another example embodiment of the invention, a CMOS logic gate is implemented in the first stage of the input buffer, rather than an inverter gate. An example of such embodiment is described in FIG. 4, where the first stage is acting like a NAND gate. In this optional embodiment, transistors N1 and N11 of FIG. 4, which are serially connected, are replacing N1 of FIG. 1, and transistors P1 and P11 of FIG. 4, which are parallelly connected, are replacing P1 of FIG. 1.

For another example embodiment of the invention, the first stage is based on the embodiment of this invention, but the second stage is implemented with conventional CMOS inverter, without the pull-up NMOS transistor in the second stage of FIG. 1. FIG. 5 describes such circuit.

For another example embodiment of the invention, the first stage is implemented based on the embodiment of this invention, or based on any embodiment of the first stage of an input buffer, but the second stage is implemented without pull-up PMOS transistor (P5 of FIG. 1). FIG. 6 describes such circuit.

Advantages of the Invented Embodiments

In the conventional buffer of the prior art circuit, both transistors of the inverter of the first stage are conducting when Vtn<VIN<VDDH−|Vtp|, causing significant current consumed by the supply. In the embodiment of this invention, both NMOS and PMOS transistors of the first stage conduct current only when 2*Vtn<VIN<VDDH−2*|Vtp|. This means that when VIN (node 10 of FIG. 1) is slightly higher than GNDH (node 70 of FIG. 1) or lower than VDDH (node 50 of FIG. 1), the supply current of the embodiments of this invention circuit is conducting much less current.

The conventional buffer of the prior art switch state typically at half of VDDH, providing a noise margin of the input signal to be ~VDDH/2. In the embodiments of this invention circuit has hysteresis response, thus the switching of the output from low to high is when VIN is higher than VDDH, typically at 60÷70% of VDDH (node 50 of FIG. 1), and switching of the outputs from high to low when VIN is lower than VDDH (node 50 of FIG. 1), typically at 30÷40% of VDDH (node 50 of FIG. 1). This characteristic means that the noise margin is increased, typically by 20÷40%, relative to the conventional circuit.

The conventional circuit for the second stage of the prior art, in case the supply voltage of the second stage is lower than the supply voltage of the first stage, has typically lower switching voltage. As a result, the delay of the first stage is becoming asymmetry, and dependent on the supply voltages of the two stages. This effect is more extreme when the supply voltage of the second stage is very low, such as when VDDL (node 60 of FIG. 2) is about 0.5V or lower. In the embodiment of this invention circuit, the delay of the second stage is much less dependent on the supply voltages, VDDH (node 50 of FIG. 1) and VDDL (node 60 of FIG. 1), and function with low delay even at extremely low levels of VDDL (node 60 of FIG. 1).

What is claimed is:

1. An input buffer circuit comprising:
a first stage, comprising:
a first CMOS inverter circuit comprising pull-down n-channel field effect transistors, wherein a gate of a first transistor of the three n-channel field effect transistor is connected to an input of the circuit, and the source of the first transistor is connected to one or several serially diode-connected n-channel field effect transistors, said serially diode-connected n-channel field effect transistors have gates connected to the drain, wherein the source of the most bottom transistor of said serially diode-connected n-channel field effect transistors is connected to a negative supply voltage of the circuit, and another n-channel field effect transistor has a source connected to the negative supply voltage and drain connected to the drain of the serially diode-connected n-channel field effect transistors, wherein the gate is connected to the output of an inverter that inverts the output of the first stage of the input buffer;
said CMOS inverter circuit further comprises pull-up p-channel field effect transistors, wherein a gate of the p-channel field effect transistor is connected to the input of the circuit, and the source is connected to one or several serially diode-connected p-channel field effect transistors have gates connected to the drain, wherein the source of the most upper transistor is connected to the positive supply voltage, and another p-channel field effect transistors with source connected to the positive supply voltage and drain connected to the drain of the serially diode-connected p-channel field effect transistors, wherein the gate is connected to the output of an inverter that inverts the output of the first stage of the input buffer.

2. The input buffer of claim 1 wherein the n-channel and p-channel field effect transistors, whose gate is connected to the input pad of the integrated circuit, are forming any CMOS logic function.

3. The input buffer of claim 1 wherein only the pull-down n-channel field effect transistors are connected as described in claim 1.

4. The input buffer of claim 1 wherein only the pull-up p-channel field effect transistors are connected as described in claim 1.

5. The input buffer of claim 1, wherein said buffer can be used as an input stage between different power domains within the same or different integrated circuits.

6. The input buffer of claim 1, further comprising an additional inverting stage of the input buffer comprising:
a pull-down n-channel field effect transistor whose gate is connected to the previous stage, the source is connected to the negative supply voltage of the power domain that is driven by the circuit and a drain connected to the output of the circuit;
an additional pull-up n-channel field effect transistor whose gate is connected to an output of the previous stage and has a logic state that is opposite than the inverted output of the previous stage, the drain is connected to the positive supply voltage of the power domain driven by the circuit, said supply voltage is equal or lower than the supply voltage of the power domain of the previous stage, and a source connected to the output of this circuit.

7. The input buffer of claim 6 wherein one of the p-channel field effect transistors is also connected to the pull-up n-channel field effect transistor, whose gate is connected to the output of the previous stage, the source is connected to the positive supply voltage of the power domain driven by the circuit and the drain is connected to the output of the circuit.

\* \* \* \* \*